(12) United States Patent
Hofmann et al.

(10) Patent No.: US 9,115,852 B2
(45) Date of Patent: Aug. 25, 2015

(54) METHOD FOR PRODUCING A PLURALITY OF LED ILLUMINATION DEVICES AND A PLURALITY OF LED CHIPSETS FOR ILLUMINATION DEVICES, AND LED ILLUMINATION DEVICE

(75) Inventors: Markus Hofmann, Bad Abbach (DE); Ralph Peter Bertram, Nittendorf (DE); Julius Muschaweck, Gauting (DE)

(73) Assignees: OSRAM Opto Semiconductors GmbH (DE); OSRAM Gesellschaft mit beschrankter Haftung (DE)

( * ) Notice: Subject to any disclaimer, the term of this patent is extended or adjusted under 35 U.S.C. 154(b) by 600 days.

(21) Appl. No.: 13/140,166

(22) PCT Filed: Dec. 18, 2009

(86) PCT No.: PCT/EP2009/067578
§ 371 (c)(1),
(2), (4) Date: Aug. 11, 2011

(87) PCT Pub. No.: WO2010/070120
PCT Pub. Date: Jun. 24, 2010

(65) Prior Publication Data
US 2011/0291123 A1 Dec. 1, 2011

(30) Foreign Application Priority Data
Dec. 19, 2008 (DE) .......................... 10 2008 064 073

(51) Int. Cl.
*H01L 29/18* (2006.01)
*F21K 99/00* (2010.01)
*F21Y 101/02* (2006.01)
H01L 25/075 (2006.01)
H01L 33/00 (2010.01)

(52) U.S. Cl.
CPC . *F21K 9/00* (2013.01); *F21K 9/135* (2013.01); *F21Y 2101/02* (2013.01); *H01L 25/0753* (2013.01); *H01L 33/0095* (2013.01); *H01L 2924/0002* (2013.01)

(58) Field of Classification Search
CPC ... H01L 31/162; H01L 33/52; H01L 33/0095; H01L 25/0753; F21K 9/00; F21K 9/135; F21Y 2101/02
USPC ........ 438/16, 26, 28, 34, 35; 257/88, 95, 100, 257/E21.521, E21.529, E21.53, E33.012
See application file for complete search history.

(56) References Cited

U.S. PATENT DOCUMENTS

| 6,508,564 B1 | 1/2003 | Kuwabara et al. |
| 2005/0030744 A1 | 2/2005 | Ducharme et al. |
| 2005/0135094 A1* | 6/2005 | Lee et al. ..................... 362/231 |

(Continued)

FOREIGN PATENT DOCUMENTS

| CN | 1629536 A | 6/2005 |
| DE | 10 2004 057 499 A1 | 7/2005 |
| DE | 10 2008 015 712 A1 | 10/2008 |

*Primary Examiner* — Khiem D Nguyen
(74) *Attorney, Agent, or Firm* — DLA Piper LLP (US)

(57) ABSTRACT

A method for producing a plurality of LED illumination devices which each emit light having an average value of a first photometric parameter including producing a plurality of LED chips which emit light of the same color; measuring values of the first photometric parameter of the LED chips; combining the LED chips to form groups of at least two LED chips which have different values of the first photometric parameter such that differences in the average values of all the LED illumination devices are imperceptible to the human eye; and equipping a respective LED illumination device with a group of LED chips.

15 Claims, 7 Drawing Sheets

(56) References Cited

U.S. PATENT DOCUMENTS

| | | |
|---|---|---|
| 2006/0061300 A1* | 3/2006 | Biebl et al. .................. 315/291 |
| 2007/0047257 A1 | 3/2007 | Yamamoto |
| 2008/0192465 A1 | 8/2008 | Huang et al. |
| 2008/0220549 A1* | 9/2008 | Nall et al. ...................... 438/26 |
| 2008/0238335 A1 | 10/2008 | Lee et al. |
| 2008/0308825 A1 | 12/2008 | Chakraborty et al. |

* cited by examiner

METHOD FOR PRODUCING A PLURALITY OF LED ILLUMINATION DEVICES AND A PLURALITY OF LED CHIPSETS FOR ILLUMINATION DEVICES, AND LED ILLUMINATION DEVICE

RELATED APPLICATIONS

This is a §371 of International Application No. PCT/EP2009/067578, with an international filing date of Dec. 18, 2009 (WO 2010/070120, published Jun. 24, 2010), which claims priority of German Patent Application 10 2008 064 073.5, filed Dec. 19, 2008, the subject matter of which is incorporated by reference.

TECHNICAL FIELD

This disclosure relates to a method for producing a plurality of LED illumination devices and a plurality of chipsets for LED illumination devices which each emit light having an average value of a first photometric parameter. The disclosure also relates to an LED illumination device comprising at least two LED chips.

BACKGROUND

In LED illumination devices comprising a plurality of LED chips, use is conventionally made of LED chips that were classified as being of the same type with regard to their color and intensity during production. This serves the purpose of equipping an LED illumination device with as far as possible identical LED chips and thereby achieving a color impression that is as homogeneous as possible.

However, on account of their production process, LED chips exhibit variations in almost all characteristic parameters, particularly in their brightness and their color locus. These variations are likewise manifested in LED illumination devices realized with LED chips.

As a consequence, therefore, clearly visible differences in the color impression can occur in such LED illumination devices. This problem is aggravated particularly in the case of white light LED chips and white light LED illumination devices, since deviations from the white point in the color space can be perceived particularly easily as a color cast by the human eye.

In particular, on account of the variations of the LED chips, LED illumination devices can differ in their color locus or their brightness, as a result of which visible differences in the color impression disadvantageously occur between LED illumination devices mounted alongside one another.

It could therefore be helpful to provide an improved production method in which differences in the color loci and/or brightness of different LED illumination devices with respect to one another, in particular white light LED illumination devices, are imperceptible to the human eye and which simultaneously affords cost advantages. In particular, it could be helpful to reduce differences in the color impression in LED illumination devices of this type. Furthermore, it could be helpful to produce an arrangement of LED chips, for example, an LED illumination device having the smallest possible deviation from a predefined color locus and/or a predefined brightness.

SUMMARY

We provide a method for producing a plurality of LED illumination devices which each emit light having an average value of a first photometric parameter including producing a plurality of LED chips which emit light of the same color, measuring values of the first photometric parameter of the LED chips, combining the LED chips to form groups of at least two LED chips which have different values of the first photometric parameter such that differences in the average values of all the LED illumination devices are imperceptible to the human eye, and equipping a respective LED illumination device with a group of LED chips.

We also provide a method for producing a plurality of LED chipsets for illumination devices which each emit light having an average value of a first photometric parameter including producing a plurality of LED chips which emit light of the same color, measuring values of the first photometric parameter of the respective LED chips, and combining the LED chips to form groups of at least two LED chips which have different values of the first photometric parameter such that differences in the average values for the illumination devices are imperceptible to a human eye.

We further provide an LED illumination device which emits light having an average value of a first photometric parameter, has a first LED chip having a first value of the first photometric parameter, and has a second LED chip having a second value of the first photometric parameter, the second value being different from the first value, wherein a difference between the first and second values of the first photometric parameter is perceptible to the human eye, and the LED chips emit light of the same color.

DETAILED DESCRIPTION

Figure 1:
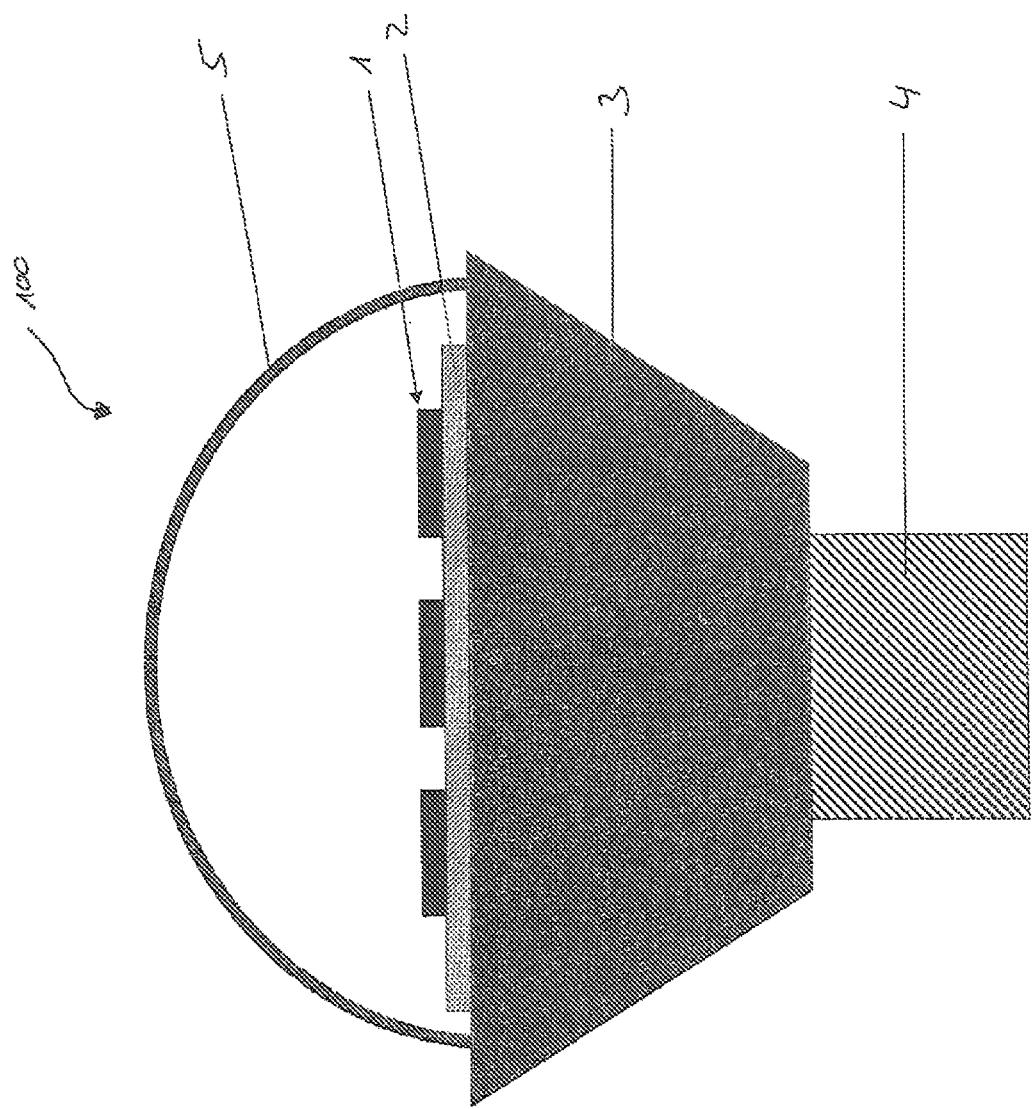
FIG. 1 shows a schematic cross section through a first example of an LED illumination device.

We provide a method for producing a plurality of LED illumination devices which each emit light having an average value of a first photometric parameter comprising the following method steps:

producing a plurality of LED chips which emit light of the same color, measuring the first photometric parameter of the respective LED chips, combining the LED chips to form groups of in each case at least two LED chips which have different values of the first photometric parameter, such that differences in the average values of all the LED illumination devices are imperceptible to the human eye, and equipping a respective LED illumination device with a group of LED chips.

A method for producing a plurality of LED chipsets for illumination devices which each emit light having an average value of a first photometric parameter may comprise the following method steps:

producing a plurality of LED chips which emit light of the same color, measuring the first photometric parameter of the respective LED chips, and combining the LED chips to form groups of in each case at least two LED chips which have different values of the first photometric parameter, such that differences in the average values for the LED illumination devices in particular for all of the LED illumination devices, are imperceptible to the human eye.

In this case, the groups of LED chips form a respective chipset for an LED illumination device. In subsequent production of an LED illumination device, therefore, a respective illumination device can be equipped with at least one such, in particular with exactly one such, LED chipset. Therefore, the features described below in connection with the LED illumination device are also applicable to the LED chipset.

An average value of the first photometric parameter of an LED chipset and, hence, of an LED illumination device is composed, in particular, of a superposition of the values of the first photometric parameter of the individual LED chips of the LED illumination device. The average value of the first photometric parameter of an LED illumination device thus relates, in particular, only to one LED illumination device in each case, and not to values of the first photometric parameter of a plurality of LED illumination devices with respect to one another. With regard to the average value, therefore, one LED illumination device in each case is considered separately.

The first photometric parameter of the LED chips and/or of the LED illumination devices preferably relates to properties related to the brightness sensitivity curve of the eye, such as, for example, color rendering index, luminous flux, color temperature, color locus, light intensity, luminance or emission characteristic.

The "color temperature" is, in particular, a measure of the color impression of a light source. It is defined as the temperature to which a black body (Planckian radiator) would have to be heated to emit light of one color which for the same brightness and under defined observation conditions is the most similar to the color to be described.

The "color locus" is understood to mean, in particular, the numerical values which describe the color of the emitted light of the LED chips or the LED illumination device in the CIE color space.

The "CIE color space" is, in particular, the CIE standard chromaticity system (also known as CIE 1931). The CIE standard chromaticity system is based on measured values related to a standard observer which can be represented in a CIE standard chromaticity diagram. In the CIE standard chromaticity diagram, the area of possible colors is plotted on a system of coordinates on which the X-component and Y-component of an arbitrary color can be read directly.

Preferably, the first photometric parameter of the LED chips and/or of the LED illumination devices relates to an extensive parameter such as, for example, the luminous flux and/or the light intensity. In this case, differences in the average values of the first photometric parameter of all the LED illumination devices can be imperceptible to the human eye if the average values differ from one another by less than 10%.

Preferably, the first photometric parameter of the LED chips and/or of the LED illumination devices relates to the color locus and/or the color temperature. In this case, differences in the average values of the first photometric parameter of all the LED illumination devices can be imperceptible to the human eye if the average values differ from one another by fewer than 10, preferably by fewer than 5, particularly preferably by fewer than 3, MacAdam threshold units.

The method dimensions a first photometric parameter of the LED chips which are provided for equipping an LED illumination device. In a further method step, the LED chips are combined in a targeted manner on the basis of the determined values of the first photometric parameter such that the average value of the first photometric parameter of different LED illumination devices differs from one another by less than 10% and/or by fewer than 10, preferably by fewer than 5, particularly preferably by fewer than 3, MacAdam threshold units.

The first photometric parameter of the LED illumination devices advantageously lies in a predefined, in particular narrow range. LED illumination devices which have a uniform appearance of the color impression are advantageously made possible. Differences visible to the human eye in the color impression between the LED illumination devices can advantageously be avoided.

Through the combination of LED chips having different values of the first photometric parameter, it is advantageously possible to use LED chips for LED illumination devices which have differences in the first photometric parameter that are visible to the human eye, without in this case bringing about differences in the average values of the photometric parameter of the LED illumination devices that are visible to the human eye. LED chips whose values of the first photometric parameter extend over a wide range can thus advantageously be used, as a result of which rejection of conventionally so-called "unusable" LED chips is advantageously reduced. Reduced rejection of the LED chips results in a cost advantage in the production of the LED illumination devices.

In a method for defining the first photometric parameter of an LED chip, the CIE color space is provided with a grid. This grid comprises two sets of intersecting grid lines, wherein one set is given by a set of Judd straight lines and the other set is given by the lines for the color loci of a Planckian radiator and the associated lines of constant threshold value deviation, such that the grid has a plurality of cells delimited by grid lines. The cells are known, in particular, as "bins." In this case, each cell is assigned a group of values of a first photometric parameter.

Afterward, the first photometric parameter of the LED chips is determined and that cell in which the first photometric parameter of the LED chip respectively lies is determined in each case.

Judd straight lines in the CIE color space are defined as straight lines of similar color temperature. They can approximately be regarded as lines of constant color temperature. The line for the color loci of a Planckian radiator is given by the color loci of a Planckian radiator for different temperatures of the Planckian radiator. The distance between a color locus and the line is determined in threshold units (TU), also known as standard deviation of color matching (SDCM).

The production method dimensions the first photometric parameter of an LED chip on the basis of the human eye in a manner closely dependent on the Planckian radiator and the Judd straight lines, that is to say straight lines of very similar color temperature. The LED chips are thus sorted into groups which correspond to the color perception sensation of the human eye.

Preferably, the difference in the values of the first photometric parameter of the LED chips of an LED illumination device is perceptible to the human eye.

LED chips having different values of the first photometric parameter which are perceptible to the human eye can advantageously be combined such that differences in the color impression of a plurality of LED illumination devices are imperceptible to the human eye, in particular are less than 10% and/or fewer than 10, preferably fewer than 5, particularly preferably fewer than 3, MacAdam threshold units. Through the targeted combination of the LED chips having different values of the first photometric parameter whose difference is perceptible to the human eye, advantageously the rejection of so-called "unusable" LED chips is reduced and can be avoided, in particular. This preferably results in a cost advantage in the production process.

Preferably, the first photometric parameter is the color locus. Preferably, the difference in the values of the color loci of the LED chips of an LED illumination device is greater than three threshold units, in particular MacAdam threshold units. By way of example, the difference is greater than 5 MacAdam threshold units, particularly preferably greater than 10 MacAdam threshold units.

A MacAdam threshold unit, also known as a "MacAdam ellipse," is that extent in the CIE-XYZ color space around a reference color locus in which the human eye cannot perceive any deviation from the reference color locus.

A difference in the color locus of the LED chips in the region of one MacAdam threshold unit is imperceptible to the average human eye. A difference in the first photometric parameter in a region of two to three MacAdam threshold units is perceptible to the average human eye only with difficulty. Differences greater than four MacAdam threshold units are clearly perceptible to the average human eye.

The difference in the values of the first photometric parameter of the LED chips of an LED illumination device, which is preferably greater than 5 MacAdam threshold units, is thus perceptible to the human eye.

Preferably, the average values of all the illumination devices differ by fewer than 10 MacAdam threshold units. Preferably, the average values differ by fewer than 5 MacAdam threshold units, particularly preferably by fewer than three MacAdam threshold units.

The differences in the color impression of the LED illumination devices with respect to one another are thus imperceptible to the human eye. LED illumination devices mounted alongside one another thus have a similar, in particular an identical, color impression to the human eye.

Preferably, the first photometric parameter is brightness. Preferably, the average values of all the LED illumination devices differ by less than 10%. Deviations in the average values of brightness from one another of less than 10% are hardly perceptible, almost imperceptible, to the human eye. Particularly preferably, the average values of all the LED illumination devices differ by less than 5%.

LED illumination devices mounted alongside one another thus have preferably hardly any, in particular no, differences in brightness that are perceptible to the human eye.

Preferably, the LED illumination devices have at least one further average value of a second photometric parameter, the first LED chip has a first value of the second photometric parameter and the second LED chip has a second value of the second photometric parameter, the second value being different than the first value, wherein the LED chips are combined to form groups such that differences in the further average values of all the LED illumination devices are imperceptible to the human eye. In particular, the further average values differ by less than 10% and/or by fewer than 10, preferably by fewer than 5, particularly preferably by fewer than 3, MacAdam threshold units.

Consequently, each LED chip is assigned two photometric parameters, preferably the color locus and brightness. Afterward, the LED chips are preferably combined to form groups such that the average values of all the LED illumination devices of the first photometric parameter and of the second photometric parameter deviate from one another by less than 10% and/or by fewer than 10, preferably by fewer than 5, particularly preferably by fewer than 3, MacAdam threshold units. In particular, the average values of the color locus of all the LED illumination devices deviate from one another by fewer than 10, preferably by fewer than 5, particularly preferably by fewer than 3, MacAdam threshold units and the average values of the brightness of all the LED illumination devices deviate from one another by less than 10%.

LED illumination devices having virtually no deviations in brightness and color locus can advantageously be obtained in this way. LED illumination devices mounted alongside one another advantageously have no differences in brightness and color locus which are perceptible to the human eye. LED illumination devices having a reproducible color impression can advantageously be produced in this way. A uniform appearance of the color impression of all the LED illumination devices is thus made possible.

Preferably, a respective LED illumination device is assigned at least one further LED chip having a further value of the first photometric parameter and/or of the second photometric parameter.

A respective LED illumination device accordingly has at least three LED chips which are combined to form a group such that differences in the average values of the first photometric parameter and/or the second photometric parameter of all the LED illumination devices are imperceptible to the human eye, in particular differ by less than 10% and/or by fewer than 10, preferably by fewer than 5, particularly preferably by fewer than 3, MacAdam threshold units. Advantageously, three or more LED chips which differ with regard to the values of the photometric parameters can thus be combined, without being rejected, which thus results in cost advantages in production. In this case, the color impression of the LED illumination devices is advantageously not disadvantageously impaired by the targeted combination of the LED chips.

Furthermore, we provide an LED illumination device which emits light having an average value of a first photometric parameter. The LED illumination device has a first LED chip having a first value of the first photometric parameter, and a second LED chip having a second value of the first photometric parameter, the second value being different from the first value. The difference between the first and second values of the first photometric parameter is perceptible to the human eye. The LED chips emit light of the same color.

LED chips having different color impressions perceptible to the human eye can advantageously be combined such that a predefined average value of the first photometric parameter of the LED illumination device arises. In this case, the LED chips emit light of the same color.

"Of the same color" means, in particular, an identical chromaticity perceived by the human observer, in particular standard observer. In this case, the primary color is perceived as the same by the human observer, for example, as white light, wherein deviations from, for example, the white point in the color space can occur as a color cast. Of the same color is accordingly, in particular, an identical primary hue, for example, white, wherein deviating color casts can occur which are perceptible to the human eye.

Preferably, the first photometric parameter is the color locus. Particularly preferably, the first value of the first photometric parameter and the second value of the first photometric parameter differ by more than 3, preferably by more than 5, particularly preferably by more than 10, MacAdam threshold units.

Deviations in the color locus of the LED chips with respect to one another are accordingly perceptible to the human eye.

Preferably, the first photometric parameter is brightness. Differences in the brightness of the LED chips with respect to one another are in this case perceptible to the human eye.

Further preferably, the LED illumination devices have at least one further average value of a second photometric parameter, the first LED chip has a first value of the second photometric parameter and the second LED chip has a second value of the second photometric parameter, the second value being different than the first value, wherein the difference between the first and second values of the second photometric parameter is perceptible to the human eye.

Particularly preferably, the first photometric parameter is the color locus and the second photometric parameter is brightness.

LED chips of the LED illumination device accordingly differ in their color locus and their brightness, wherein the differences are perceptible to the naked human eye.

Further preferably, a radiation-transmissive covering containing scattering particles is disposed downstream of the LED chips in the emission direction.

The covering is advantageously a diffusely scattering covering which is preferably used as an optical mixing element in the LED illumination device. The covering preferably mixes the light emitted by the individual LED chips of an LED illumination device such that a mixed radiation emitted by the LED illumination device is generated.

Preferably, the LED chips of an LED illumination device are arranged and electrically contact-connected on a common circuit board, for example, a carrier board. The circuit board can be, in particular, a printed circuit board (PCB).

Particularly preferably, the LED illumination device has a radiation exit side which lies opposite the circuit board and through which radiation generated in the LED illumination device can leave the LED illumination device.

Preferably, the LED chips are thin-film LED chips. In the context of the application, a thin-film LED chip is considered to be an LED chip during whose production the growth substrate, on which a semiconductor layer sequence comprising a respective LED chip was grown epitaxially, for example, has been stripped away.

The layers of the LED chips are preferably based on a III/V compound semiconductor material. A III/V compound semiconductor material comprises at least one element from the third main group, such as, for example, Al, Ga, In, and an element from the fifth main group, such as, for example, N, P, As. In particular, the term "III/V compound semiconductor material" encompasses the group of binary, ternary or quaternary compounds which contain at least one element from the third main group and at least one element from the fifth main group, in particular nitride and phosphide compound semiconductors. Such a binary, ternary or quaternary compound can additionally comprise, for example, one or more dopants and additional constituents.

Preferably, the LED chips each have an active layer for generating radiation. The active layer of the LED chips has in each case a pn-junction, a double heterostructure, a single quantum well (SQW) or a multi quantum well (MQW) structure for generating radiation. In this case, the designation quantum well structure does not exhibit any significance with regard to the dimensionality of the quantization. It therefore encompasses, inter alia, quantum wells, quantum wires and quantum dots and any combination of these structures.

Preferably, the LED chips, in particular the circuit board, are arranged on a heat sink. Thus, the heat produced during the operation of the LED chips can be optimally dissipated from the LED illumination device via the heat sink.

Further features, advantages, preferred configurations and expediencies of the LED illumination device and the method for producing a plurality of LED illumination devices will become apparent from the examples explained below in conjunction with FIGS. 1 to 7.

Identical or identically acting constituent parts are in each case provided with the same reference symbols. The constituent parts illustrated and also the size relationships of the constituent parts among one another should not be regarded as true to scale.

FIG. 1 illustrates a cross section through an example of an LED illumination device 100. The LED illumination device 100 comprises a lamp holder 4, a heat sink 3 arranged thereon, a circuit board 2 arranged thereon with a plurality of LED chips 1 arranged on the circuit board 2, and a covering 5.

The LED chips 1 preferably each have an active layer suitable for generating electromagnetic radiation. The LED chips 1 are in each case preferably embodied in thin-film design. In particular, the LED chips 1 preferably comprise epitaxially deposited layers which respectively form the LED chip 1. The layers of the LED chips 1 are preferably based on a III/V compound semiconductor material.

The circuit board 2 of the LED illumination device 100 preferably contains a thermally conductive material. Particularly preferably, the circuit board 2 is a printed circuit board, in particular a PCB.

The heat sink 3 preferably contains a thermally conductive material. Preferably, the heat produced during the operation of the LED chips 1 is dissipated via the circuit board 2 to the heat sink 3 and emitted from there from the LED illumination device 100 to the surroundings of the LED illumination device 100.

A covering 5 is preferably disposed downstream of the LED chips 1 in the emission direction. The LED illumination device 100 accordingly has a radiation exit side which is remote from the circuit board 2 and from which the radiation emitted by the LED chips 1 can emerge.

Preferably, the covering 5 is radiation-transmissive to the radiation emitted by the LED chips 1. Particularly preferably, the covering 5 contains scattering particles, preferably diffusely scattering particles. The covering 5 thus serves as an optical mixing element of the radiation emitted by the individual LED chips 1. Increased mixing of the radiation emitted by the individual LED chips 1 is advantageously effected in this way. Preferably, the LED illumination device 100 emits mixed radiation of the radiation emitted by the LED chips 1.

The LED chips 1 preferably emit radiation in the white color locus range. A white color impression can arise, for example, by superposition of a first wavelength and a second wavelength. Preferably, all the LED chips 1 of the LED illumination device 100 emit white light. An LED chip 1 of the LED illumination device 100 can have a semiconductor body, which emits a first wavelength, and additionally a converter, which at least partially converts the first wavelength into a second wavelength, which is different than the first wavelength. The impression of white light can arise as a result of superposition of the first and second wavelengths. By way of example, the first wavelength lies in the blue wavelength range and the second wavelength lies in the yellow wavelength range.

To minimize deviations of the LED illumination devices 100 with respect to one another, the LED chips 1 are combined to form groups of at least two LED chips 1 in each case. The LED chips 1 in this case have different values of a first photometric parameter, wherein the difference is perceptible to the human eye. The LED chips 1 are combined to form groups such that differences in the average values of the first photometric parameter of all the LED illumination devices 100 with respect to one another are imperceptible to the human eye, and in particular differ by less than 10% and/or by fewer than 10, preferably by fewer than 5, particularly preferably by fewer than 3, MacAdam threshold units. A uniform appearance with regard to the color impression of the LED illumination devices 100 is advantageously made possible.

The targeted combination of LED chips 1 which have a difference in the respective color impression that is perceptible to the human eye enables a cost advantage in the production of the LED illumination device 100, since a rejection of so-called "unusable" LED chips is advantageously reduced.

The method for producing LED illumination devices 100 and the targeted combination of LED chips 1 to form groups are in each case explained in greater detail in FIGS. 3 to 7.

Figure 2:
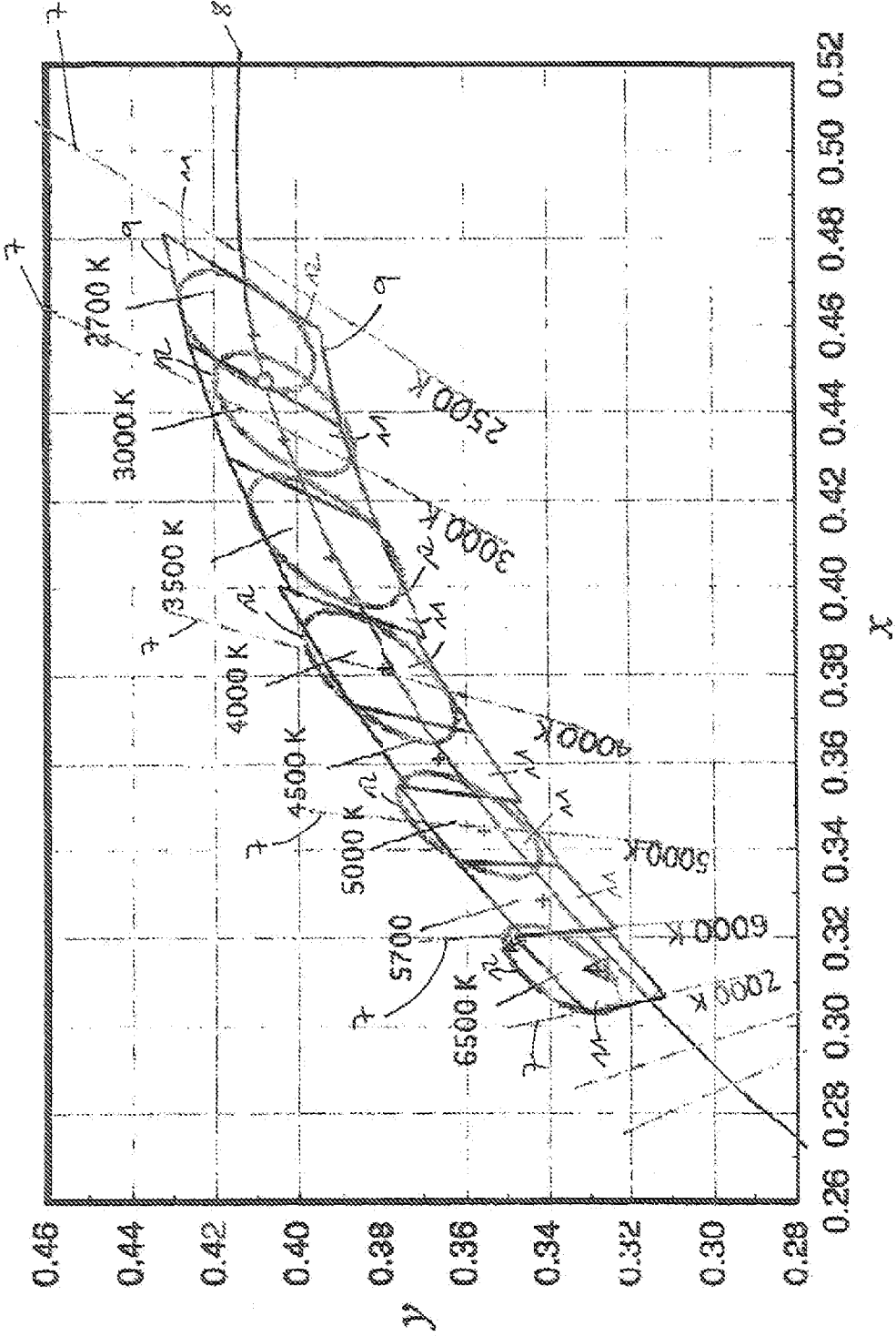
FIG. 2 shows an excerpt from the CIE color space in the vicinity of the line of the Planckian radiator.

FIG. 2 shows an excerpt from the CIE color space in the vicinity of the line of the Planckian radiator.

In particular, the CIE 1931 color space is illustrated in FIGS. 2 to 5. The three-dimensional XYZ color space is shown as a two-dimensional CIE standard chromaticity diagram.

To define a grid, Judd straight lines 7 having the color temperatures 2500 K, 3000 K, 4000 K, 5000 K, 6000 K and 7000 K are plotted, which form a set of grid lines. The line 8 of the color loci of a Planckian radiator and also lines of constant threshold value deviations 9 are furthermore plotted.

FIG. 2 furthermore illustrates cells 11, here boxes having a black border, which are known as so-called "bins."

LED chips that respectively lie in a common cell 11 each have similar photometric parameters.

Conventionally, LED chips whose photometric parameters fall within a cell 11 are in each case used for equipping an LED illumination device. However, LED chips from different regions, for example, corners, of a cell 11 disadvantageously differ in their photometric parameter, for example, the color locus or brightness, such that the difference is perceptible to the human eye.

MacAdam ellipses 12 are furthermore depicted in FIG. 2. A MacAdam ellipse 12 is that extent in the CIE diagram around a reference hue in which the human eye cannot perceive any deviation from the reference color locus. Photometric parameters of LED chips which fall within a MacAdam ellipse are perceived as identical by the human eye.

As illustrated in FIG. 2, cells 11 each have regions that lie outside a MacAdam ellipse 12. Values that fall within such regions are thus interpreted as different with respect to a reference hue by the human eye. The regions lie, in particular, in corners of a respective cell 11.

LED illumination devices having LED chips from the same cell 11 can thus have deviations of the photometric average parameter with respect to one another which are perceptible to the human eye, as a result of which a non-uniform appearance of the LED illumination devices conventionally arises.

LED illumination devices which are mounted alongside one another and each have LED chips from a cell 11 can thus disadvantageously have differences in, for example, the color locus or brightness that are perceptible to the eye.

To avoid the differences, therefore, LED chips having different values of the photometric parameters are combined such that differences in the average values of different LED illumination devices are imperceptible to the human eye, and in particular differ from one another by less than 10% and/or by fewer than 10, preferably by fewer than 5, particularly preferably by fewer than 3, MacAdam threshold units. Explanations concerning the combination of the LED chips are shown in FIGS. 3 to 5.

Figure 3:
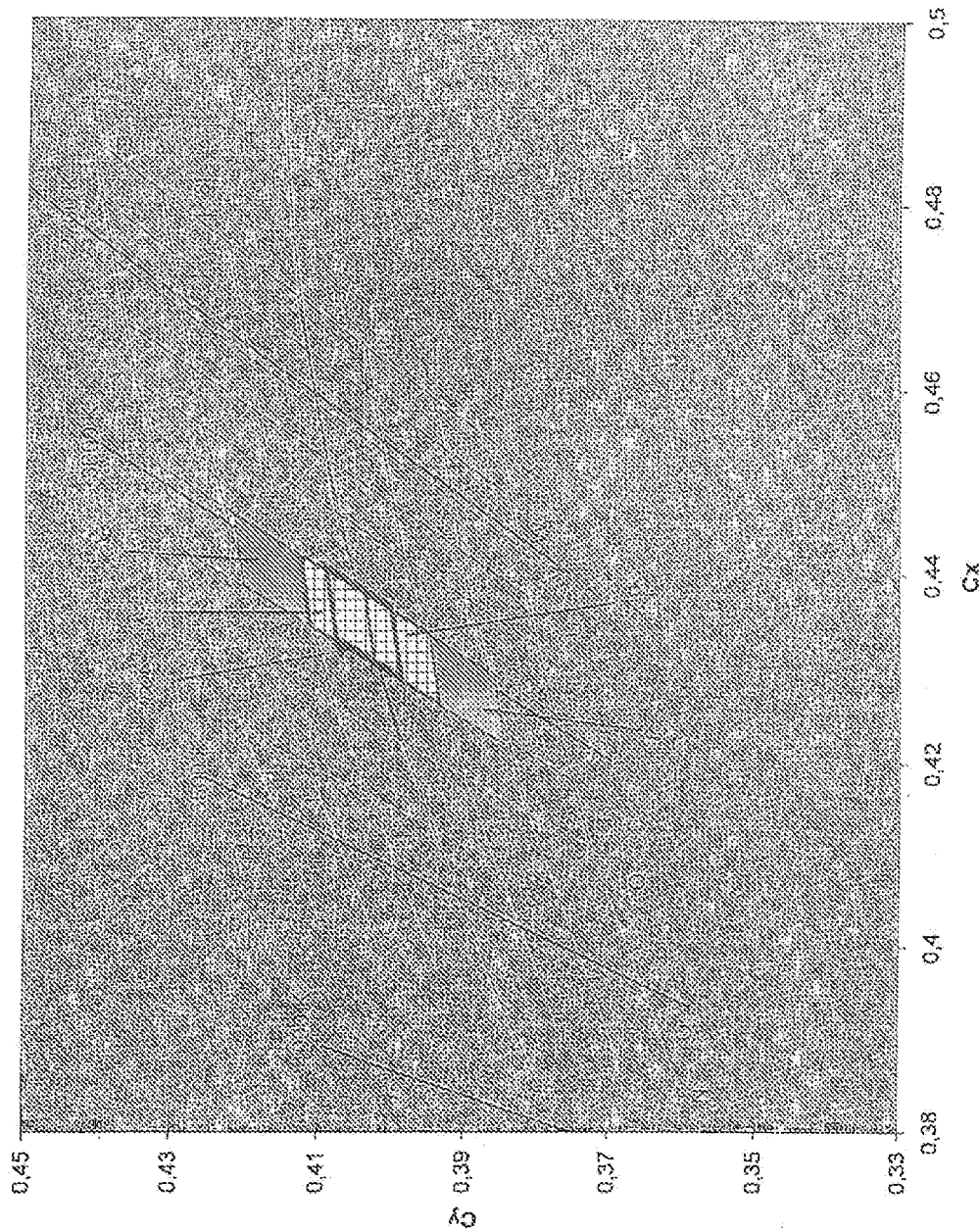
FIG. 3 shows a further excerpt from the CIE color space in the vicinity of the line of the Planckian radiator with (illustrated therein) possible combinations of cells of a respective group of two LED chips for a further LED illumination device.
Figure 4:
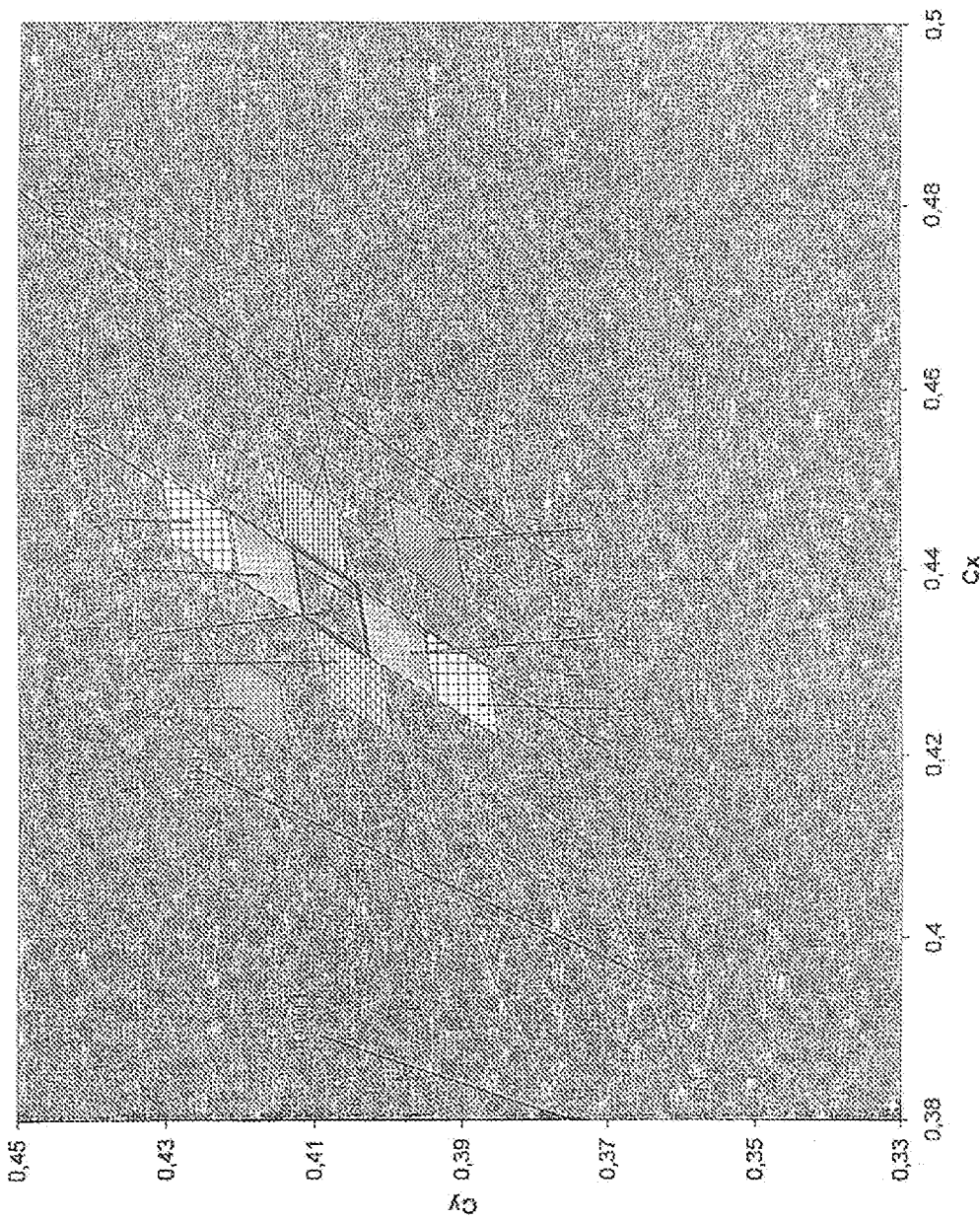
FIG. 4 shows a further excerpt from the CIE color space in the vicinity of the line of the Planckian radiator with (illustrated therein) further combinations of cells of a respective group of two LED chips for a further LED illumination device.
Figure 5:
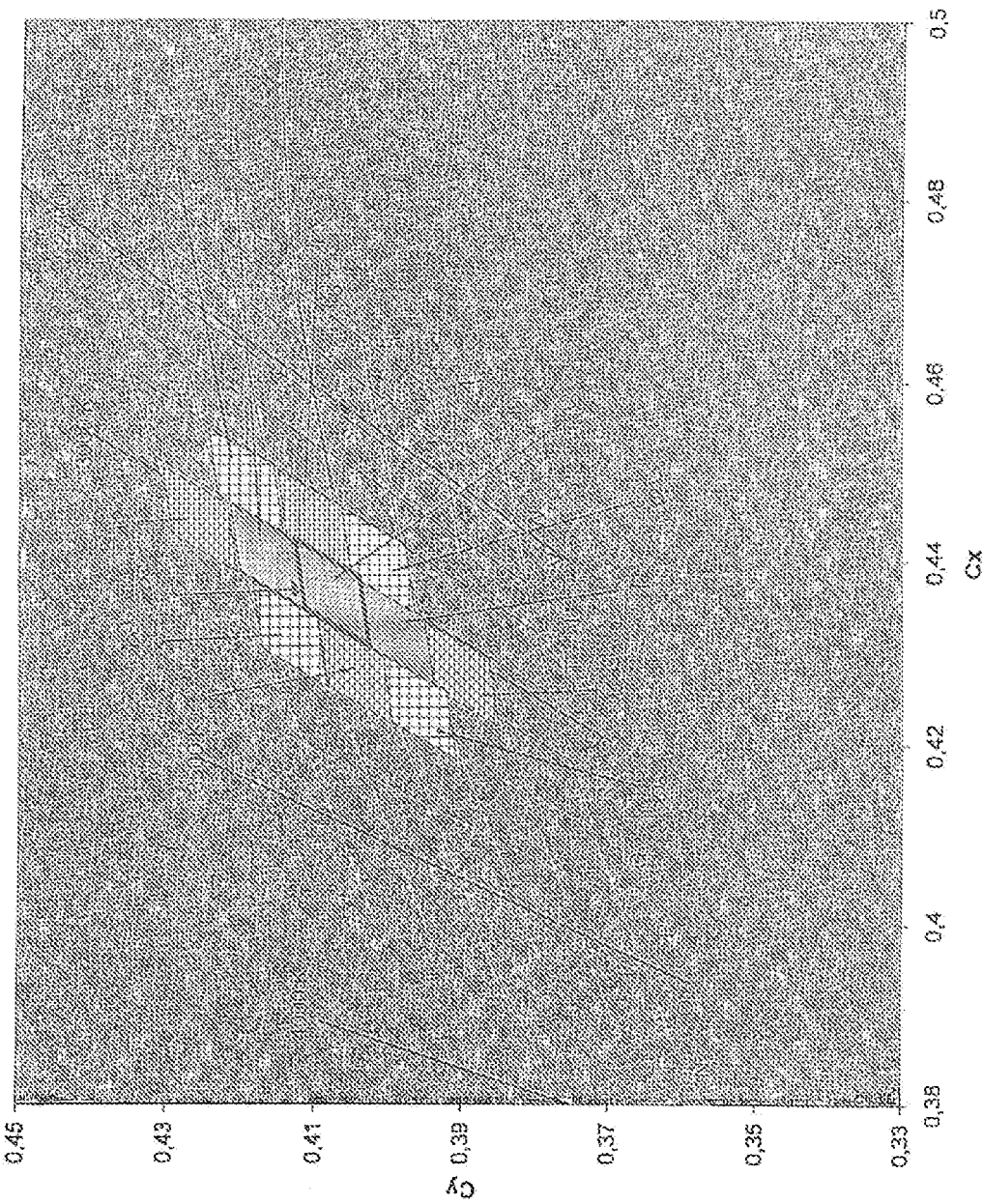
FIG. 5 shows a further excerpt from the CIE color space in the vicinity of the line of the Planckian radiator with (illustrated therein) further combinations of cells of a respective group of three or four LED chips for a further LED illumination device.

FIGS. 3 to 5 each illustrate excerpts from the CIE color space in the vicinity of the line of the Planckian radiator 8. As in the example of FIG. 2, Judd straight lines 7 are plotted to define the grid. The Judd straight lines in FIGS. 3 to 5 have the color temperatures 2700 K, 3000 K, 3500 K, and 4000 K. Furthermore, as in FIG. 2, lines having constant threshold value deviations are plotted.

For the LED chips to be sorted, in each case a first photometric parameter, for example, the color locus or brightness, of each LED chip is determined and the associated cell is determined. Afterward, LED chips are combined to form groups of in each case at least two LED chips having different values of the first photometric parameter, such that differences in the average values of different LED illumination devices are imperceptible to the human eye. In particular, the average values of all the LED illumination devices differ by less than 10% and/or by fewer than 10, preferably by fewer than 5, particularly preferably by fewer than 3, MacAdam threshold units.

These groups of LED chips respectively form chipsets which can be processed further to form LED illumination devices.

In particular, LED chips which fall within different cells are combined in the production method. The combination of the LED chips then produces the average value of the photometric parameter of the chipset and thus of the LED illumination device produced therewith. In this case, average values of different LED illumination devices are determined such that they fall within a predefined cell region in which the human eye cannot perceive any deviation from the reference color locus. In other words, in particular, a difference in the photometric parameters of the LED illumination devices is imperceptible to the average human eye. The average values of all the LED illumination devices accordingly lie in the same cell region, while the values of the LED chips fall within different cells.

A first example of LED illumination devices which have an average value of the first photometric parameter in an identical cell region, and therefore virtually do not have deviations in the first photometric parameter of the LED illumination devices with respect to one another that are perceptible to the human eye, is illustrated in FIG. 3.

FIG. 3 indicates two LED illumination devices, each having two LED chips. The LED devices are therefore each formed with a chipset having two LED chips. The average value for a respective LED illumination device of a first photometric parameter, for example, the color locus or brightness, lies in the cell region 100a, which is in each case illustrated as a box with a black border in FIGS. 3 to 5.

The first LED illumination device has a first LED chip, whose value of the first photometric parameter falls within the cell 5S, here illustrated as a hatched region 10a. The second LED chip of the first LED illumination device has a value of the first photometric parameter which falls within the cell 8S, here illustrated as a hatched region 10b. Superposition of the values of the first photometric parameter of the first LED chip and of the second LED chip of the first LED illumination device results in an average value of the first photometric parameter of the LED illumination device in the cell region 100a.

A second LED illumination device has a first LED chip, whose value of the first photometric parameter falls within the cell 6S, here illustrated as a checked region 1a. A second LED chip of the second LED illumination device has a second value of the first photometric parameter, which falls within the region 7S, here illustrated as a checked region 1b. Superposition of the values of the first photometric parameter of the first LED chip and of the second LED chip of the second LED illumination device results in an average value that falls within the cell region 100a.

Accordingly, through targeted combination of LED chips which have different values of a photometric parameter, in particular fall within different cells, it is possible to produce LED illumination devices which fall within the same region 100a with regard to the average value of the photometric parameter. In this case, deviations in the average values of the photometric parameter between the LED illumination devices are imperceptible to the human eye. By contrast, differences in the values of the LED chips used for an LED illumination device can be perceptible to the human eye, wherein, through a targeted combination of the LED chips, deviations in the average values of the first photometric parameter between the LED illumination devices are imperceptible.

FIG. 4 illustrates, as in the example with regard to FIG. 3, further targeted combinations of LED chips which each have an average value of an LED illumination device in the same cell region 100a.

By way of example, a combination of a first LED chip, whose value of the first photometric parameter falls within the cell 5S, here illustrated as a checked region 10a, with a second LED chip, whose value of the first photometric parameter falls within the cell 9S, here illustrated as a checked region 10b, produces an average value of the LED illumination device which falls within the cell region 100a.

Likewise, the combination of a first LED chip, whose value of the first photometric parameter falls within the cell 5U, with a second LED chip, whose value of the first photometric parameter falls within the cell 9Q, here in each case illustrated as a hatched region 20a, 20b, produces an average value of a second LED illumination device which falls within the cell region 100a.

Such an average value of a further LED illumination device having two LED chips furthermore results from a combination of a first LED chip, whose value of the first photometric parameter falls within the cell 7R, with a second LED chip, whose value falls within the cell 7T, here illustrated in each case as regions 30a, 30b.

The average value of the photometric parameter which falls within the cell region 100a likewise arises as a result of a combination of an LED chip having a value of the first photometric parameter in the cell 6S with an LED chip having a value of the first photometric parameter in the cell 8S, here illustrated as hatched areas 1a, 1b.

LED illumination devices which each have two LED chips and are combined with one another as explained above in each case have an average value of the first photometric parameter which falls within the same cell region 100a. Deviations in the average values between the LED illumination devices are thus imperceptible to the human eye. A uniform appearance of the LED illumination devices is advantageously made possible.

FIG. 5 shows a further example of a further possible targeted combination of LED chips for LED illumination devices which have reduced differences of average values of a first photometric parameter.

In contrast to the examples described in FIGS. 3 and 4, in FIG. 5 three and four LED chips are respectively combined to form groups, wherein the average values of the first photometric parameter of the LED illumination devices with respect to one another preferably have deviations of less than 10% and/or by fewer than 10, preferably by fewer than 5, particularly preferably by fewer than 3, MacAdam threshold units.

A first LED illumination device has three LED chips, wherein the value of the first photometric parameter of a first LED chip falls within the cell 6S, the value of the first photometric parameter of a second LED chip falls within the cell 7S, and the value of the first photometric parameter of a third LED chip falls within the cell 6S. Superposition of the values of the first photometric parameter of the three LED chips results in an average value which falls within the cell region 100a. The cell region of the average values 100a is illustrated as a box with a black border, and the cell of the values of the first, second and third LED chips of the first LED illumination device is respectively illustrated as a hatched area 1a, 1b, 1c.

A second illumination device has four LED chips, wherein the value of the first photometric parameter of a first LED chip falls within the cell 6R, the value of the first photometric parameter of a second LED chip falls within the cell 6T, the value of the first photometric parameter of a third LED chip falls within the cell 8T, and the value of the first photometric parameter of a fourth LED chip falls within the cell 8R, here respectively illustrated as a checked area 20a, 20b, 20c, 20d. Superposition of the values of the first, second, third and fourth LED chips results in an average value of the first photometric parameter of the second LED illumination device in the cell region 100a.

It is likewise possible to combine four LED chips whose value of the first photometric parameter of the first LED chip falls within the cell 5S, the value of the first photometric parameter of the second LED chip falls within the cell 7T, the value of the first photometric parameter of the third LED chip falls within the cell 9S and the value of the first photometric parameter of the fourth LED chip falls within the cell 7R, here illustrated as regions 10a, 10b, 10c, 10d. Such a combination of the LED chips, in the same way as in the case of the first and second LED illumination devices, produces an average value of the first photometric parameter which falls within the cell region 100a.

The first LED illumination device, the second LED illumination device and the third LED illumination device thus have virtually no differences in the first photometric parameter that are perceptible to the human eye.

Figure 6:
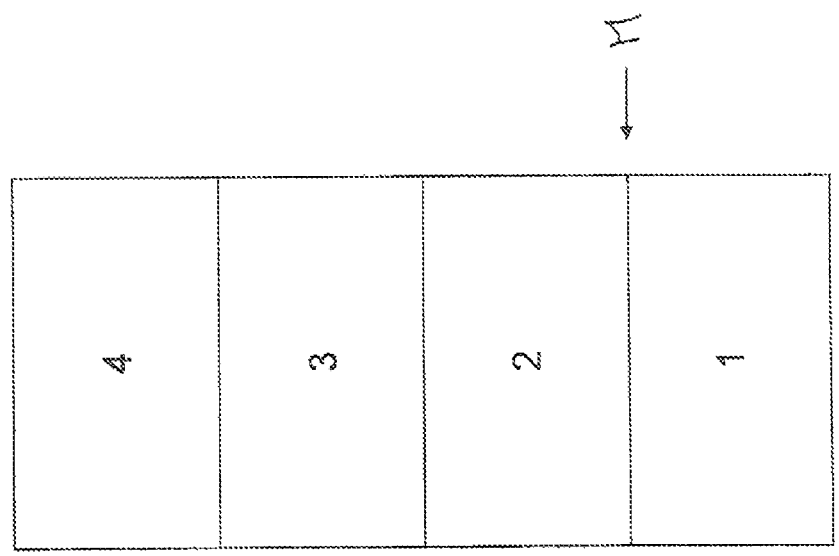
FIG. 6 shows a schematically illustrated excerpt from the brightness sensitivity for combination of two LED chips to form a group of a further LED illumination device.

The example in FIG. 6 illustrates an example of the combination of different brightness distributions of LED chips. The brightness rises from the cell 1 to the cell 4. In particular, brightnesses that fall within the cell 1 are perceived as dark by the human eye, while brightnesses that fall within the cell 4 are perceived as bright by the human eye. The predefined minimum brightness M required for LED chips in LED illumination devices is illustrated by means of an arrow in FIG. 6.

If, by way of example, an LED illumination device having an average value in the cell 2 is desired, it is possible to combine LED chips which, with regard to their brightness distribution, in each case fall within the cell 2. Alternatively, it is possible to combine LED chips whose brightness distributions fall within the cell 1 and the cell 3. An LED illumination device having a brightness distribution which falls within the cell 2 then arises by means of superposition.

Consequently, it is advantageously possible additionally for some of the excessively dark LED chips from the cell 1 to be utilized and to be combined with excessively bright LED chips from the cell 3 to obtain an illumination device having a brightness distribution in the cell 2. The reject rate of the LED chips is advantageously minimized. LED chips whose brightness distributions fall within cells 1 or 3 therefore advantageously are not counted as rejects of the production method and can be used further.

Figure 7:
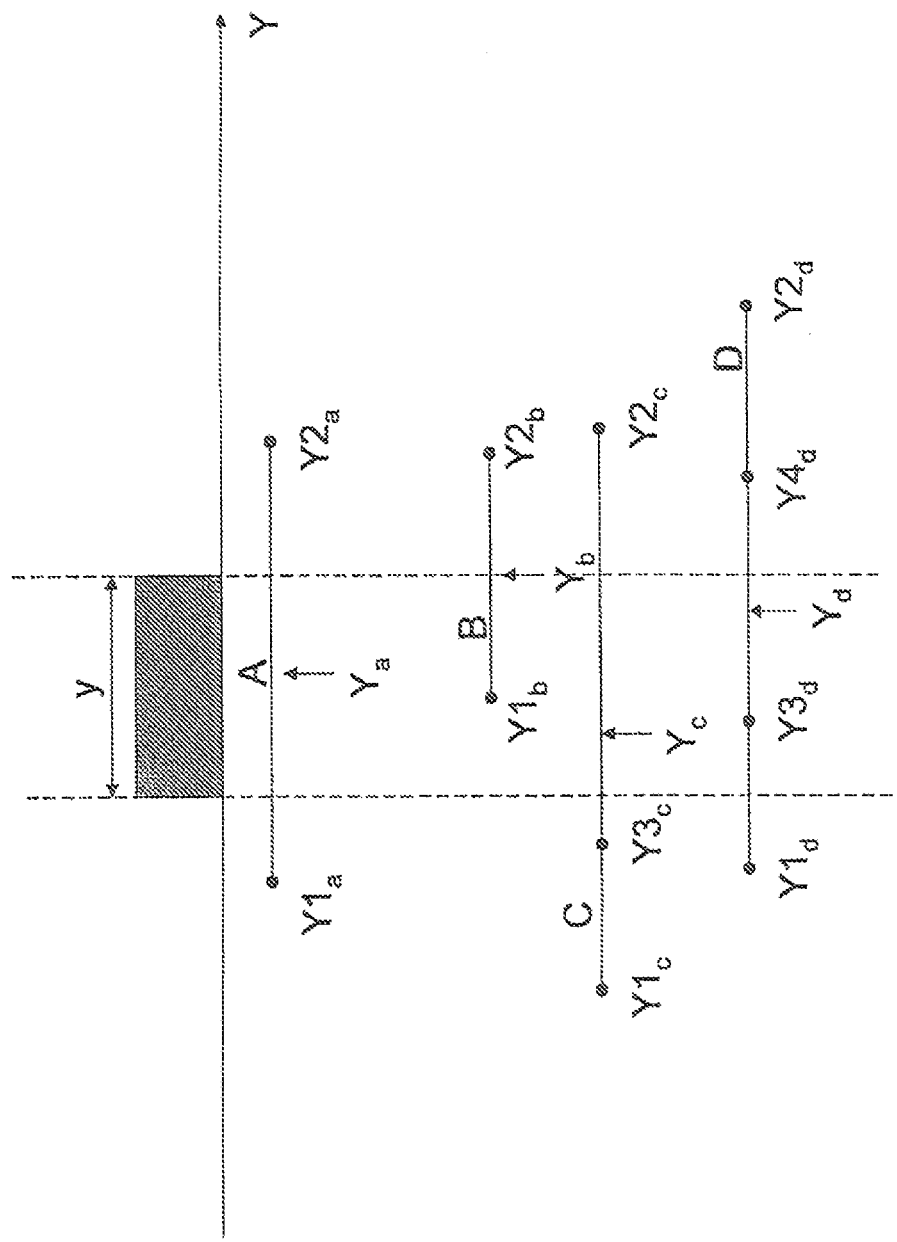
FIG. 7 shows a schematic illustration of possible combinations of LED chips to form a respective group of a respective further LED illumination device having an arbitrary photometric parameter Y.

FIG. 7 illustrates possible examples of LED chips each having an arbitrary photometric parameter Y. LED illumination devices comprising such a combination of LED chips each have an average value of the photometric parameter Y.

Differences in the average values of the photometric parameter Y of the LED illumination devices which fall within the range y shown in FIG. 7 are imperceptible to the human eye.

FIG. 7 presents the photometric parameters of LED illumination devices A, B, C, D each having at least two LED chips. The average values $Y_a$, $Y_b$, $Y_c$, $Y_d$ of the four LED illumination devices A, B, C, D each fall within the desired range y in which differences in the values are imperceptible to the human eye.

The LED illumination device A has two LED chips $1_a$, $2_a$, whose values of the photometric parameter $Y1_a$, $Y2_a$ lie outside the desired range y. However combination of the LED chips $1_a$, $2_a$ advantageously results in an average value $Y_a$ that falls within the desired range.

A desired average value $Y_b$ likewise arises through a further possible combination of two further LED chips $1_b$, $2_b$.

A third LED illumination device has three LED chips $1_c$, $2_c$, $3_c$, whose values $Y1_c$, $Y2_c$, $Y3_c$ of the photometric parameter do not fall within the range y, but the average value $Y_c$ falls within the range y.

An LED illumination device D having four LED chips $1_d$, $2_d$, $3_d$, $4_d$ can, through targeted combination of the LED chips, likewise have an average value $Y_d$ of the photometric parameter Y in the desired range y.

If an LED illumination device is formed with LED chips that are classified in groups according to a method of this type, wherein LED chips having different values of a photometric parameter are used, then this LED illumination device has advantageously low color deviations. A rejection of unusable LED chips can advantageously be reduced, in particular avoided, thus resulting in a cost advantage of the production method.

The explanation of the LED illumination device on the basis of the examples described above should not be regarded as a restriction thereto. Rather, this disclosure encompasses any novel feature and also any combination of features, which in particular includes any combination of features in the appended claims, even if those features or the combination itself are or is not explicitly specified in the claims or the examples.

The invention claimed is:

1. A method of producing a plurality of LED illumination devices which each emit light having an average value of a first photometric parameter and a further average value of a second photometric parameter comprising:
    producing a plurality of LED chips which emit light of a same color;
    measuring values of the first photometric parameter and values of the second photometric parameter of the LED chips, wherein the first photometric parameter is a color locus and the second photometric parameter is a brightness;
    combining the LED chips to form groups of at least two LED chips which have different values of the first photometric parameter and different values of the second photometric parameter such that differences in the average values and differences in the further average values of all the LED illumination devices are imperceptible to the human eye; and
    equipping a respective LED illumination device with a group of LED chips.

2. The method according to claim 1, wherein the average values of all the LED illumination devices differ by less than 10% and/or by fewer than five MacAdam threshold units.

3. The method according to claim 1, wherein a difference in values of the first photometric parameter of the LED chips of an LED illumination device is perceptible to the human eye.

4. The method according to claim 1, wherein a difference in the values of the first photometric parameter of the LED chips of an LED illumination device is greater than five MacAdam threshold units.

5. The method according to claim 4, wherein the average values of all the LED illumination devices differ by fewer than three MacAdam threshold units.

6. The method according to claim 1, wherein the respective LED illumination device is assigned at least one further LED chip having a further value of the first photometric parameter and/or of the second photometric parameter.

7. A method of producing a plurality of LED chipsets for illumination devices which each emit light having an average value of a first photometric parameter and a further average value of a second photometric parameter comprising:
    producing a plurality of LED chips which emit light of a same color;
    measuring values of the first photometric parameter and values of the second photometric parameter of the respective LED chips, wherein the first photometric parameter is a color locus and the second photometric parameter is a brightness; and
    combining the LED chips to form groups of at least two LED chips which have different values of the first photometric parameter and different values of the second photometric parameter such that differences in the average values and differences in the further average values for the illumination devices are imperceptible to a human eye.

8. The method according to claim 7, wherein the average values of all the LED illumination devices differ by less than 10% and/or by fewer than five MacAdam threshold units.

9. The method according to claim 7, wherein a difference in the values of the first photometric parameter of the LED chips of an LED illumination device is perceptible to the human eye.

10. The method according to claim 7, wherein difference in the values of the first photometric parameter of the LED chips of an LED illumination device is greater than five MacAdam threshold units.

11. The method according to claim 10, wherein the average values of all the LED illumination devices differ by fewer than three MacAdam threshold units.

12. The method according to claim 7, wherein a respective LED illumination device is assigned at least one further LED chip having a further value of the first photometric parameter and/or of the second photometric parameter.

13. An LED illumination device which
emits light having an average value of a first photometric parameter and an average value of a second photometric parameter;
has a first LED chip having a first value of the first photometric parameter and a first value of the second photometric parameter; and
has a second LED chip having a second value of the first photometric parameter, said second value of the first photometric parameter being different from the first value of the first photometric parameter, the second LED chip further having a second value of the second photometric parameter, said second value of the second photometric parameter being different from the first value of the second photometric parameter,
wherein a difference between the first and second values of the first photometric parameter is perceptible to the human eye, a difference between the first and second values of the second photometric parameter is perceptible to the human eye, and the first photometric parameter is the color locus and the second photometric parameter is brightness, and
the LED chips emit light of a same color.

14. The LED illumination device according to claim 13, wherein the first value of the first photometric parameter and the second value of the first photometric parameter differ by more than five MacAdam threshold units.

15. The LED illumination device according to claim 13, wherein a radiation-transmissive covering containing scattering particles is disposed downstream of the LED chips in an emission direction.

* * * * *